Dec. 12, 1961 | D. E. WEBB ET AL | 3,013,152

TUNING DEVICE

Filed April 26, 1960 | 2 Sheets-Sheet 1

INVENTORS.
DONALD E. WEBB
ELDON D. ALDRED

BY Nicholas Lang Jr.
ATTORNEY

INVENTORS.
DONALD E. WEBB
ELDON D. ALDRED
BY
ATTORNEY

United States Patent Office 3,013,152

Patented Dec. 12, 1961

3,013,152

TUNING DEVICE

Donald E. Webb, deceased, late of Indianapolis, Ind., by Mrs. Donald E. Webb, administratrix, Casper, Wyo., and Eldon D. Aldrer, Indianapolis, Ind., assignors to P. R. Mallory & Co., Inc., Indianapolis, Ind., a corporation of Delaware Filed Apr. 26, 1960, Ser. No. 24,854
6 Claims. (Cl. 334—54)

This invention relates generally to electro-magnetic energy tuning devices operative over a wide band of high frequency ranges and has specific application to such devices including means and methods for inductively tuning high frequency apparatus, and the like.

The present invention relates to multi-sectioned tuning devices including continuously variable tuning coils of the inductance type in which the improved construction allows for exceeding diminution of the volume usually required. For example, the present tuning device can be made as much as seven times smaller than the normal tuning mechanism, while maintaining "Q" ratings far in excess of the necessary minimum specifications.

Each of the inductive tuning elements used in the assembly, or receiver, or transmitter tuner front end, as the multi-sectioned device is called, is adapted to display a linear relationship between frequency and rotation so that a conventional dial may be replaced by a numerical counter or wheel type index.

The tuner is constructed to linearly cover a range of 30–76 mc. with a band-switch or break at 53 mc. The invention includes a printed circuit slide switch which is adapted to band-switch each of a number of printed circuit type modular "RF" and antenna boards which are assembled to form a tuning head or front end. A common shaft actuates each of the band-switches.

The invention is therefore a considerable advance in the construction of miniature electronic assemblies, and moreover, the individual electronic assemblies are so constructed that they are easily demountable and readily removable and servicable from the tuning head or main assembly, itself.

The tendency toward miniaturization of electronic elements such as tube, resistors, coils, capacitors, has made it necessary to reduce the over-all dimensions of tuning and switching components to cope with this reduction in size. In addition to this, since this compactness of construction brings its own problems of maintenance and repair, accessibility of all portions of the tuner for quick repair or replacement becomes a must. The construction now offered permits the fulfillment of all these criteria by providing an assembly of easily removable modular boards upon which the components may be arranged in conjunction with spiral inductors in ganged relationship to a slidable multiple circuit switching mechansm for allowing the discriminating use of multi-band tuning.

It is therefore an object of the present invention to provide a miniature inductive tuning assembly having improved constructional features of band-switching and which has improved frequency versus rotational characteristics.

Another object of the present invention is to provide an improved spiral wound tuning device adapted for inductive tuning in a series of resonant circuits giving improved linear tuning characteristics.

Another object of the present invention is the provision of a miniature inductive tuning assembly made up of a plurality of readily removable sub-assemblies, each of which is composed of units slideably received within the sub-assembly.

Another object of the present invention is to provide a band changing switch of improved and novel construction used in a linear tuning characteristic spiral tuner which will give predetermined rotational positional accuracy during tuning.

Yet another object of the present invention is to provide an improved spiral wound tuning device adapted for inductively tuning resonant circuits of multi-bands of very high frequency electrical signals.

Still another object of the present invention is the provision of inductive tuning devices having new and improved coil form assembly to which an improved switch member and associated control elements are connected so as to particularly adapt the use of the tuning device for compact arrangement.

Although the novel features which are characteristics of the invention are set forth more in detail in the claims appended hereto, the nature and scope of the invention may be better understood by reference to the following description taken in connection with the accompanying drawings forming a part thereof and in which a specific embodiment has been set forth for purposes of illustration.

In the drawings, FIG. 1 is a perspective, partly broken away section view of an embodiment of the invention of a new inductive tuning assembly showing the arrangement of the inductive spiral ribbon in relation to an associated component carrying panel and slider switch mechanism for determining the separate frequency bands of the tuner.

Figure 1:
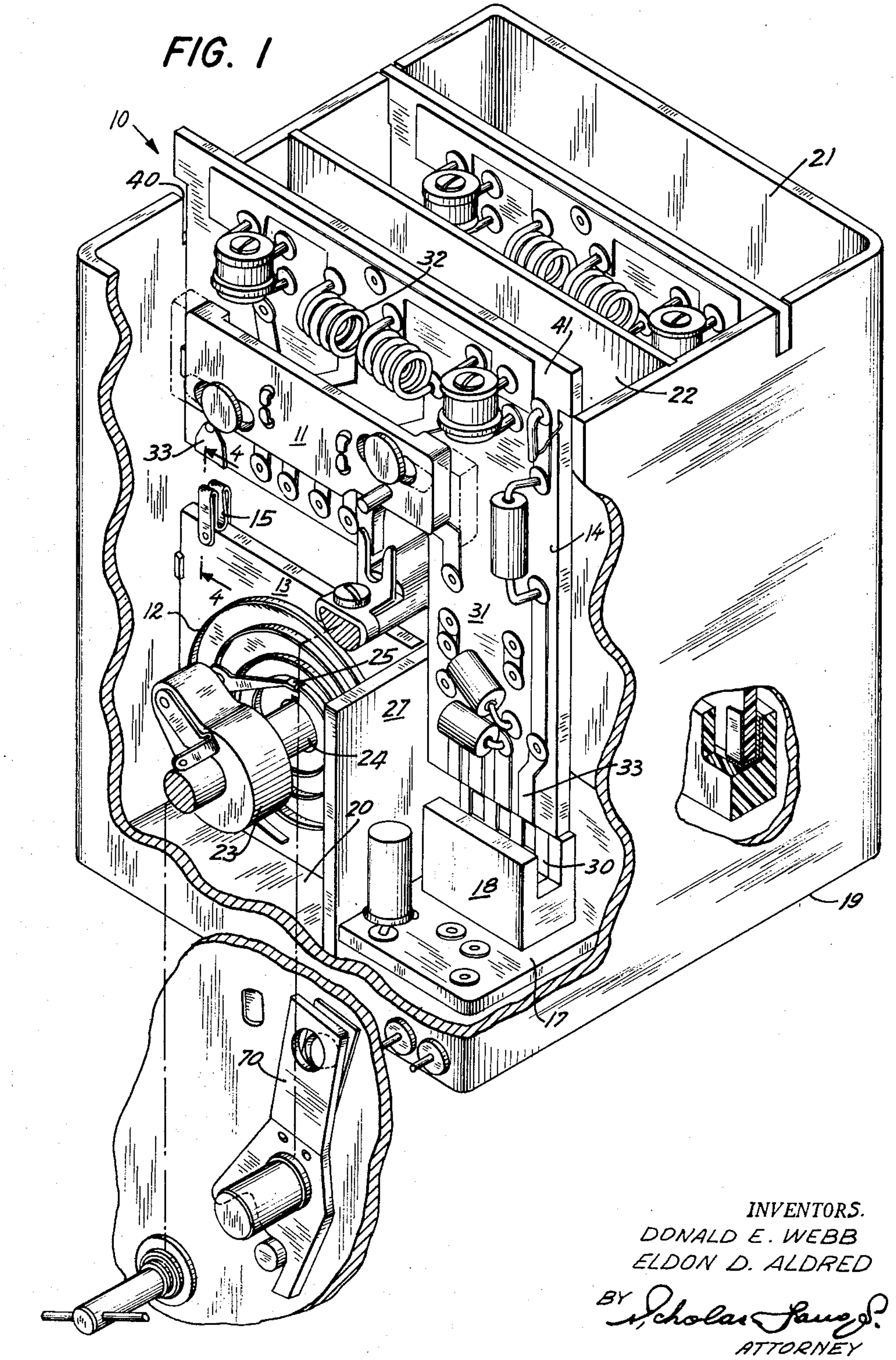

In the following description, certain specific terms are used for convenience in referring to the various details of the invention. These terms are to be interpreted, however, in accordance with the state of the art.

Generally speaking, the present invention relates to a continuously variable tuning device of the inductance type. In accordance with the invention, a spiral wound conductor having a ribbon configuration has one of its edges vertically embedded in an insulative base, such as plastic, and held in an upright manner therein. The multiple turns of the conductor are spirally wound within each other and fixedly retained in the insulator base. A hinged contact arm having a wiper is then allowed to ride on the outer edge of the conductor in an essentially expanding manner dependent upon the angular relationship of the hinge to the conductor.

The spiral inductor has been constructed to obtain a linear frequency versus rotation characteristic. This is made by winding a silver ribbon, starting at some distance from the center of the spiral, with an even increasing radius. After approximately 5 to 8 turns are wound, the silver ribbon is formed into an exponential curve to a point which will be tangential to the frame or housing of the tuner. The spiral is inserted into grooves or is molded into a dielectric material base. Such a base posseses a low dissipation factor and preferably a low dielectric constant. The completed tuning device is then formed by housing the spiral into a metallic frame of the desired number of sections, furnishing shielding between the sections and then supplying electrostatic shielding.

The great need for minimizing unwanted capacitances and inductances which could unbalance the linear characteristics sought, and the necessity of being able to assemble and disassemble the electronic components associated with the tuner, per se, has been achieved in the assembly by the use of novel vertical slider component carrying panels. These panels move into intimate vertical engagement with spring slider tuner terminals and are removable without disturbing the actual spirals of the tuners.

The spiral of each of the tuner elements has its exponentially curved end electrically connected to a shield. A second contact is created by attaching a lead to the center of the spiral and bringing this lead to the desired location in or on the housing. Tuning is accomplished, as stated, by moving the contactor arm along the convoluted spiral. The contactor arm is then, in fact, electrically connected to the housing causing the inductance to vary between the center of the spiral and the contact point as the contactor is rotated.

Incorporated in the tuning mechanism is a printed circuit slide switch which functions to band-switch each of a number of printed circuit type modular "RF" and antenna boards which are assembled to form a tuning head. A common shaft actuates each of the separate band-switches. Since it is desired that each of the modular boards may be removed without disturbing the band-switch shaft, the switch is integrally related to each of the separate boards. The switch is capable of switching any desired number of circuits operative at given frequencies.

Figure 2:
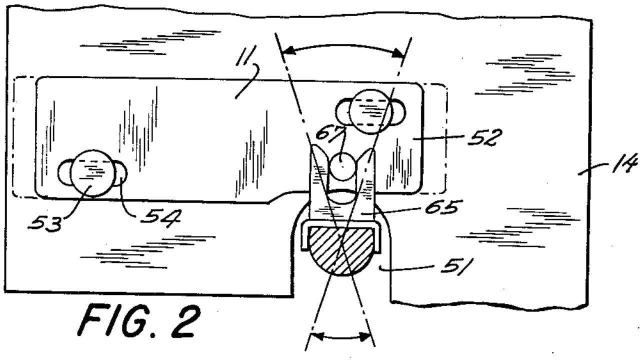
FIG. 2 is a partial front elevational view of the actuator and switching slide of the switching mechanism for determining the separate frequency bands of the tuner.

Referring more particularly to the drawings, there is shown in FIGS. 1 and 2, a front end section, or multiple tuning section 10 constructed to accept very high frequency electrical energy signals. This front end includes (*a*) the switch slide 11 (*b*) the printed circuit boards 14 (*c*) tuning coil 12 and mounting boards 13 (*d*) the contacts 15 for connecting the printed circuit to the tuning coils (*e*) parent board 17 (*f*) parent board connector means 18 and the casing 19 including top (not shown), bottom, 20 and side walls 21 and shielding partitions 22.

It is desirable that since the tuner is to be used in communication equipment having dialing or counting indicia, that the spacing between indices be uniform. This would make the tuner linear. This is accomplished, as stated above, by utilizing a termination lead of an exponential nature. It possesses a spacing between itself and the outermost turn of the spiral which is ever-increasing. The length is in the order of one-half of a turn around the spiral. The spiral, constructed in this manner; i.e., a planar spiral with an exponential lead going to a point on a totally inductively shielded case, will possess a characteristic inductance which is mostly increasing or decreasing when the contactor arm rides along the face of the spiral.

This result can be explained by electro-magnetic field considerations. Normally a spiral is ended at a determined point. This causes the spiral to have "$n$" turns just before the point of termination or "$(n-1)$" immediately beyond the point of termination. This fact causes an abrupt change in the geometry of the electro-magnetic field which produces the inductance. By tapering the termination in an exponential fashion, this abrupt change is avoided. By terminating the lead at a point on a totally enclosed conducting casing, a unipotential field is set up around the spiral which further enhances this gentle changing of the spiral field geometry.

The casing 19 is made of silver or silver clad copper by bending two sides and two ends at right angles. Shields 22 are inserted into the sides parallel to the ends so as to form equally spaced cavities. Blocks or plates 13 of extremely high quality dielectric material have the inductance spirals 12 mounted in grooves formed in one face thereof or imbedded therein. The dimensions of the blocks are such that the inductance spirals are located in the center of each of the cavities or sections. The plates for the spirals are of a minimum thickness capable of holding the ribbon inductances in place within the grooves formed therein.

The rotors or contactor arms 23 are connected to a shaft 24 which extends into each of the sections. The contacts 25 of the arms ride on the outside face of the spiral. Terminals for the spirals are created by bringing one lead from the spiral to a desired point on the case and another lead from the center of the spiral to an adjacent point. These leads are insulated from each other and from the case at all points.

As shown in the figures, the tuner casing has been constructed to avoid needless stray capacitances and inductances. At one side, using approximately one half of the allotted volume of the casing the tuning coils are arranged on vertical insulated panels. At the side thereof is a metal shield 27 having approximately the same height as the coil supports. This shield separates the tuning elements per se, from a parent component board 17 which includes terminal connector strips having a plurality of spring connectors 30 thereon, as well as carrying on its top and bottom, electrical components such as resistors, diodes, inductors, and capacitors. Both the tuner coils and the component carrying and connector terminal board are fixedly retained within the tuning casing.

Figure 4:
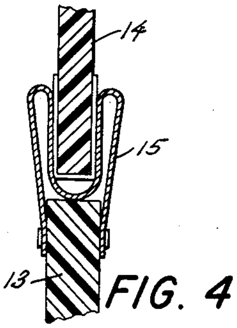
FIG. 4 is a vertical sectionalized view of FIG. 1 taken along line 4—4 thereof.
Figure 5:
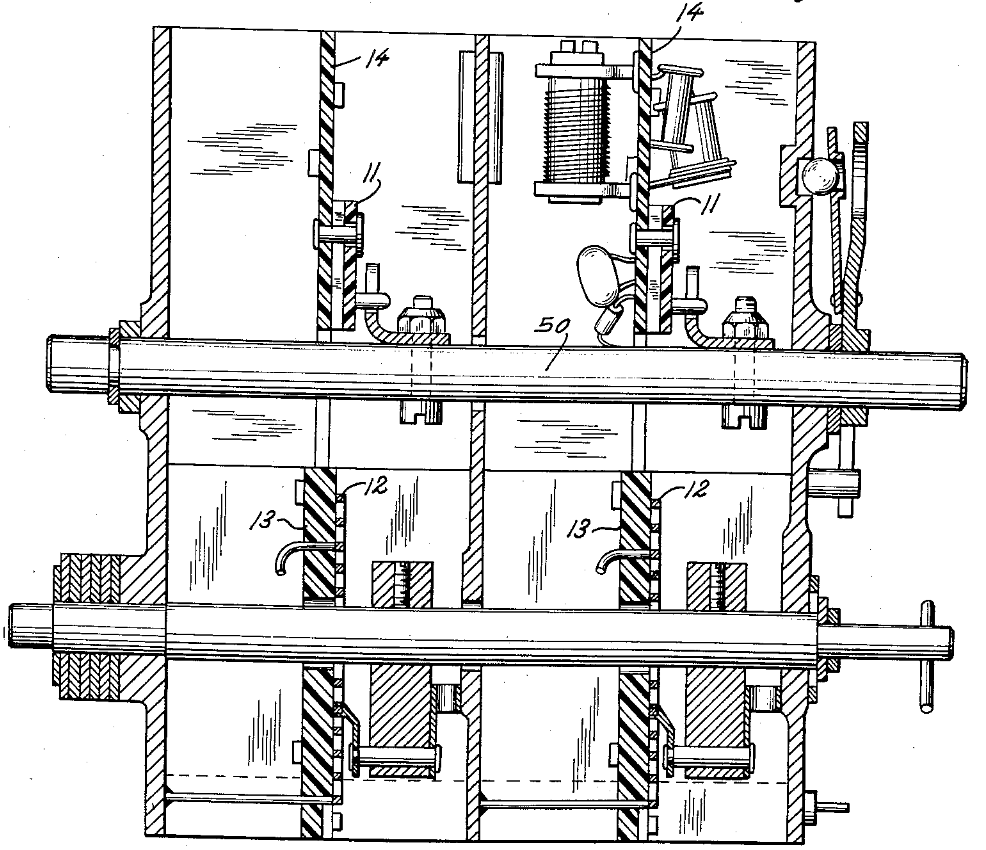
FIG. 5 is a longitudinal cross-sectional view of the tuner assembly of an embodiment of the invention.
Figure 3:
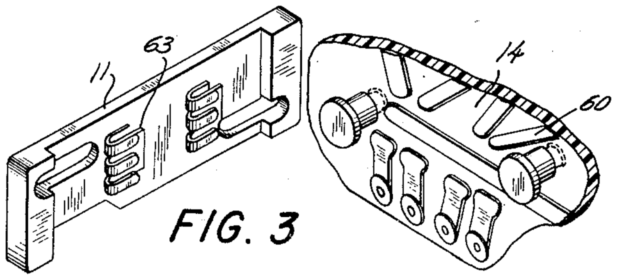
FIG. 3 is an exploded perspective view of the switch slide mechanism of the invention in conjunction with a portion of the printed circuit.

The tuning casing is constructed to receive sliding component carrying, printed circuit panels into intimate engagement with the tuner spirals and the external fixed parent contact boards. Each panel is of unique construction so that it can be vertically mounted adjacent the tuner spirals to be connected therewith, as well as carrying a slider switch 11 adapted to be placed in cooperative relationship with each of several similar panels included by the separate tuning sections. This slider switch will move in relationship to printed circuit terminals and conductors to switch electromagnetic energy into several frequency bands determined by the circuiting on the panel which will place determined reactances into engagement with the rotatable tuner spiral. A portion 31 of the printed circuit board extends downwardly at right angles to the main section 32 of the board and carries end printed conductor terminals 33 which are gripped by the spring terminals 30 on the fixed parent board 17. The configuration of the printed circuit board takes on an inverted L shaped form. At the top of the sides of the casing two guide slots 40 are formed into which a T shaped collar 41 integrally formed to the printed circuit boards is inserted. When the boards are vertically inserted into the slots and struck out guide ears (FIG. 5), the printed terminals of the main section of the board slide into connection with the mating spring terminals at the tuner section and those of the parent panel section (FIG. 4). The engagement of all terminals is extremely tight and allows for good electrical conductivity between sections of the printed circuit board, the inductance spiral, and the parent component carrying board.

As stated, each printed circuit board is of an inverted L shaped configuration and carries a slider switch assembly (FIG. 2) thereon which is adapted to be actuated between printed circuit terminals defining the frequency bands covered by the tuner. Each of the switches is ganged and actuated simultaneously with corresponding switches on the other circuit boards by means of a shaft 50 which passes through an arced cut-out 51 formed in the board.

The sliding switch 11 consists of a thin rectangular flat insulator plate 52 which is attached to each printed circuit board by means of integrally formed idler or guide pins 53 fitted into guide slots 54 cut out of opposing ends of the plate. Each printed circuit board has its switch terminals 60 printed thereon. Adjacent thereto on one flat side of the switch plate are the three finger switch contacts 63 formed of arcuately shaped flat spring ribbons staked to the plate. The actuator shaft 50 has a U shaped dual pronged clutching member 65 which accepts an integrally formed post 67 extending horizontally out from the switch plate. This post falls within the prongs of the clutching member to be actuated and moved upon angular rotation of the actuator. An indexing plate 70 is placed on the front wall of the casing which allows for detenting and indexing of the switch positions.

In the construction of the tuner, the desirability of ready accessibility of all portions of the tuner assembly for quick repair or replacement has been achieved. The tuning shaft 24 is completely separated from the actuator 65 of the sliding band switch. The actuator 65 of the sliding band switch, by its construction remains in place while the printed circuit boards can be removed by simply lifting the printed boards upwardly away from the shaft while it is in the unlocked position. Moreover each of the boards are vertically aligned to one another by means of the guide slots and ears placed in the walls of the tuner casing.

The present invention of the tuner assembly with its band switching features and demountable circuit boards is merely illustrative and not exhaustive in scope and since many widely different embodiments of the invention may be made without departing from the scope thereof. It is intended that all matter contained in the above description and shown in the accompanying drawing shall be interpreted as illustrative and not in a limiting sense.

What is claimed is:

1. A tuner assembly for accepting very high frequency signals comprising a casing formed of side walls and end walls forming a rectangular cavity therebetween, a spiral wound inductance on an insulator plate placed vertically therein, a rotating tuning arm moveable thereon for tuning said inductance, a parent component carrying board fixedly placed alongside said inductance, a metal shield separating said board from said inductance to form a separate compartment therebetween, said parent board and said insulator plate carrying said spiral inductance board having spring finger contactors extending therefrom, a circuit defining board having electrical conductors, terminals, and electrical components thereon, said board having a main section and a dependent section placed at right angles to each other, said board slidably insertable into said cavity of said tuner to be placed on top of said spiral inductance to be electrically connected thereto by said spring contactors, said dependent section thereof being slidably connected to said terminals of said parent board by said spring contactors, a sliding switch placed on said main section of said circuit board, said switch discriminatingly connecting separate terminals thereon to define circuits for accepting different frequency bands in conjunction with said spiral inductances and a shaft for actuating said sliding switch between said bands, said entire tuner assembly having its parts readily accessible for servicing and replacement without disturbing the spiral inductances and the separate tuning arm and actuating shaft.

2. A tuner assembly for accepting very high frequency signals comprising a hollow casing formed of side walls and end walls forming a rectangular cavity therebetween, a spiral wound inductance on an insulator plate placed vertically therein, a rotating tuning arm moveable thereon for tuning said inductance, a parent component carrying board fixedly placed alongside said inductance, a metal shield separating said board from said inductance to form separate compartment therebetween, said parent board and said insulator plate carrying said inductance having spring finger contactors extending upwardly therefrom, a circuit defining board carrying electrical conductors, terminals, and components thereon, said board having a main section and a dependent section, said main section slidably inserted into said cavity of said tuner to be placed on top of said inductance to be electrically connected thereto, by said contactors, dependent section thereof being slidably connected to said terminals of said parent board by said spring contactors, a sliding switch placed on said main section of said circuit board, said switch discriminatingly connecting separate terminals thereon to define circuits for accepting various frequencies in conjunction with said spiral inductances and a shaft for actuating said slider switch.

3. A tuner assembly for accepting very high frequency signals comprising a casing of side walls and end walls forming a rectangular cavity, a spiral wound inductance on an insulator plate placed vertically therein, a rotating tuning arm radially moveable by a shaft for tuning said inductance, a parent component carrying board fixedly placed alongside said inductance, a metal shield separating said board from said inductance to form a separate compartment therebetween, said parent board and said insulator plate carrying said spiral inductance having spring finger contactors extending therefrom, a separate circuit defining board having electrical conductors, terminals, and electrical components thereon, said board having a main section and a dependent section placed at right angles to each other, said board slidably insertable into said cavity of said tuner to be placed above said spiral inductance to be electrically connected thereto by said spring contactors, said dependent section thereof being slidably connected to said terminals of said parent board by said spring contactors, a sliding switch placed on said main section of said circuit board, said switch discriminatingly connecting separate terminals thereon to define circuits for accepting different frequency bands in conjunction with said spiral inductances, and a shaft having coupling means for actuating said sliding switch between said bands, said entire tuner assembly having its parts readily accessible for servicing and replacement without disturbing the spiral inductances and the separate tuning and actuating shafts.

4. A tuner assembly for accepting very high frequency signals comprising a casing of side walls and end walls forming a rectangular cavity therebetween, a spiral wound inductance on an insulator plate placed vertically therein, a rotating tuning arm moveable thereon by a shaft for tuning said inductance, a parent component carrying board fixedly placed along-side said inductance, a metal shield separating said board from said inductance to form a separate compartment therebetween, said parent board and said insulator plate carrying said spiral inductance board having spring finger contactors extending therefrom, a circuit defining board having electrical conductors, terminals, and electrical components thereon, said board having a main section and a dependent section placed at right angles to each other, said board slidably insertable into said cavity of said tuner to be placed on top of said spiral inductance to be electrically connected thereto by said spring contactors, said dependent section thereof being slidably connected to said terminals of said parent board by said spring contactors, a flat sliding switch placed on said main section of said circuit board, said switch having contactors discriminatingly connecting separate terminals on said circuit board to define circuits for accepting different frequency bands in conjunction with said spiral inductances and a shaft for actuating said sliding switch between said bands, said entire tuner assembly having its parts readily accessible for servicing and replacement without disturbing the spiral inductances and the separate tuning and actuating shafts.

5. A tuner assembly for accepting very high frequency signals comprising a casing of side walls and end walls forming a rectangular cavity therebetween, a spiral wound inductance on an insulator plate placed vertically therein, a rotating tuning arm moveable thereon by a shaft for tuning said inductance, a parent component carrying board fixedly placed along-side said inductance at the bottom of said casing, a metal shield, substantially of the same height of said insulator plate, separating said parent board from said inductance to form a separate compartment in said casing, said parent board and said insulator plate carrying said spiral inductance board having spring finger contactors extending therefrom, a circuit defining board having electrical conductors, terminals, and electrical components thereon, said board having a main section and a dependent section placed at right angles to each other, said board slidably insertable into said cavity of said tuner to be placed on top of said spiral inductance to be electrically connected thereto by said spring contactors, said dependent section thereof being slidably connected to said terminals of said parent board by said spring contactors, a sliding switch placed on said main section of said circuit board, said switch discriminatingly connecting separate terminals thereon to define circuits for accepting different frequency bands in conjunction with said spiral inductances and a shaft for actuating said sliding switch between said bands, said entire tuner assembly having its parts readily accessible for servicing and replacement without disturbing the spiral inductances and the separate tuning and actuating shafts.

6. A tuner assembly for accepting very high frequency signals comprising a casing of side walls and end walls forming a rectangular cavity therebetween, a spiral wound inductance on an insulator plate placed vertically therein, a rotating tuning arm moveable thereon by a shaft for tuning said inductance, a parent component carrying board fixedly placed along-side said inductance at the bottom of said casing, a metal shield substantially of the same height of said insulator plate separating said parent board from said inductance to form a separate compartment in said casing, said parent board and said insulator plate carrying said spiral inductance board having spring finger contactors extending therefrom, a circuit defining board having electrical conductors, terminals, and electrical components thereon, said board having a main section and a dependent section placed at right angles to each other, said board slidably insertable into said cavity of said tuner to be placed on top of said spiral inductance to be electrically connected thereto by said spring contactors, said dependent section thereof being longer than said main section and being slidably connected to said terminals of said parent board by said spring contactors, a flat sliding switch having contactors placed on said main section of said circuit board, said switch discriminatingly connecting separate terminals thereon to define circuits for accepting different frequency bands in conjunction with said spiral inductances and a shaft for actuating said sliding switch between said bands, said entire tuner assembly having its parts readily accessible for servicing and replacement without disturbing the spiral inductances and the separate tuning and actuating shafts.

References Cited in the file of this patent

UNITED STATES PATENTS

| | | |
|---|---|---|
| 2,070,599 | Hubbell et al. | Feb. 16, 1937 |
| 2,178,600 | Millermaster | Nov. 7, 1939 |
| 2,694,150 | Bussard | Nov. 9, 1954 |
| 2,763,776 | Bussard et al. | Sept. 18, 1956 |
| 2,922,043 | Decker et al. | Jan. 19, 1960 |